(12) United States Patent
Rahman et al.

(10) Patent No.: US 8,397,112 B2
(45) Date of Patent: Mar. 12, 2013

(54) TEST CHAIN TESTABILITY IN A SYSTEM FOR TESTING TRI-STATE FUNCTIONALITY

(75) Inventors: Mujibur Rahman, Plano, TX (US); Timothy Anderson, Dallas, TX (US); Alan Hales, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 284 days.

(21) Appl. No.: 12/969,939

(22) Filed: Dec. 16, 2010

(65) Prior Publication Data

US 2012/0036408 A1 Feb. 9, 2012

Related U.S. Application Data

(60) Provisional application No. 61/371,382, filed on Aug. 6, 2010.

(51) Int. Cl.
*G01R 31/28* (2006.01)

(52) U.S. Cl. .................................. 714/726; 714/734

(58) Field of Classification Search .................. 714/726, 714/734
See application file for complete search history.

(56) References Cited

U.S. PATENT DOCUMENTS

| | | | |
|---|---|---|---|
| 7,290,191 B2 * | 10/2007 | Grise et al. ..................... | 714/726 |
| 7,322,000 B2 * | 1/2008 | Colunga et al. ................ | 714/727 |
| 7,743,298 B1 * | 6/2010 | Bhatia et al. ................... | 714/726 |
| 7,840,863 B2 * | 11/2010 | Grise et al. ..................... | 714/726 |
| 2002/0199144 A1 * | 12/2002 | Yamauchi ....................... | 714/726 |
| 2003/0079165 A1 * | 4/2003 | Ffrench et al. ................. | 714/726 |
| 2006/0242505 A1 * | 10/2006 | Bialas et al. .................... | 714/726 |

* cited by examiner

*Primary Examiner* — Yolanda L Wilson
(74) *Attorney, Agent, or Firm* — John R. Pessetto; W. James Brady; Frederick J. Telecky, Jr.

(57) ABSTRACT

An embodiment of the invention provides system for detecting faults on a test chain. A circuit provides a test signal to an input of a test chain. The test chain includes a plurality of buffers connected in series. A register receives a logical value representing the output of the test chain. The register sends the logical value representing the output of the test chain to test circuitry where the value is observed.

14 Claims, 4 Drawing Sheets

US 8,397,112 B2

TEST CHAIN TESTABILITY IN A SYSTEM FOR TESTING TRI-STATE FUNCTIONALITY

BACKGROUND

Integrated circuits (ICs) often contain millions of transistors and millions of interconnections. To verify that these transistors and interconnections operate as intended, they must be tested. Many testing techniques may be used to verify the operation of an IC.

For example, broadside testing includes electrically stimulating the inputs of an IC and measuring the outputs of the IC to determined if the output matches the predicted output. In the case where the predicted output matches the measured output, the IC may be functioning correctly. However, this test alone does not guarantee that the IC will function 100 percent correctly. More tests are needed to verify that the IC is operating as designed.

In the case where broadside testing is used and the measured output does not match the predicted output, the IC may not be operating correctly. This type of testing indicates that there may be problems with the IC. However, this type of testing usually does not indicated what in particular caused the IC to operate incorrectly. To better diagnose what may be causing the IC to fail, internal scan testing may be used.

Internal scan testing provides a means to test interconnections and transistors without using physical test probes. Internal scan testing usually adds one or more so called 'test cells' connected to each pin of an IC that can selectively override the functionality of that pin. These cells can be programmed via a JTAG (Joint Test Action Group) test chain to drive a signal onto a pin and across an individual interconnection. The cell at the destination of the interconnection can then be programmed to read the value at the pin, verifying that the IC trace properly connects the two pins. If the trace is shorted to another signal or if the trace has been cut, the correct signal value may not be presented at the destination pin, and the IC will be observed to have a fault.

Because these cells can be used to force data into an IC, they may be used to set up test conditions. The relevant electronic states (ones and zeros) created as a result of the test conditions, may then be fed back into a test system to verify the functionality of a part of an IC. By adopting this technique, it is possible for a test system to gain test access to many parts of an IC. However, the additional circuitry added to an IC in order to enable internal scan testability may have functional problems as well. The additional circuitry added to an IC in order to enable internal scan testability must be tested as well in order to increase the probability that the IC functions as designed.

DETAILED DESCRIPTION

The drawings and description, in general, disclose a system for detecting faults in a test chain. In one embodiment, the test chain is used in testing circuits that have nodes that may be tri-stated during normal operation. For example, a one-hot transmission-gate multiplexer usually has a tri-state node. To test this tri-state node, a pull-up transistor may be added to the one-hot transmission-gate multiplexer. During normal operation of the one-hot transmission-gate multiplexer the added pull-up transistor is inactivated. However, when testing a tri-state node in the one-hot transmission-gate multiplexer, the pull-up transistor is activated to weakly pull the tri-stated node to a high logical value by a test signal on the test chain.

In this example, when a tri-state node in a one-hot transmission-gate multiplexer is tested, faults may be indicated. These faults may be caused by stuck-at faults or opens located in the one-hot transmission-gate multiplexer or they may be used by a struck-at fault or open in the test chain 142. Because the test chain includes buffers to propagate the test signal and the output of the test chain is stored in a test register, faults in the test chain may be identified.

Figure 1:
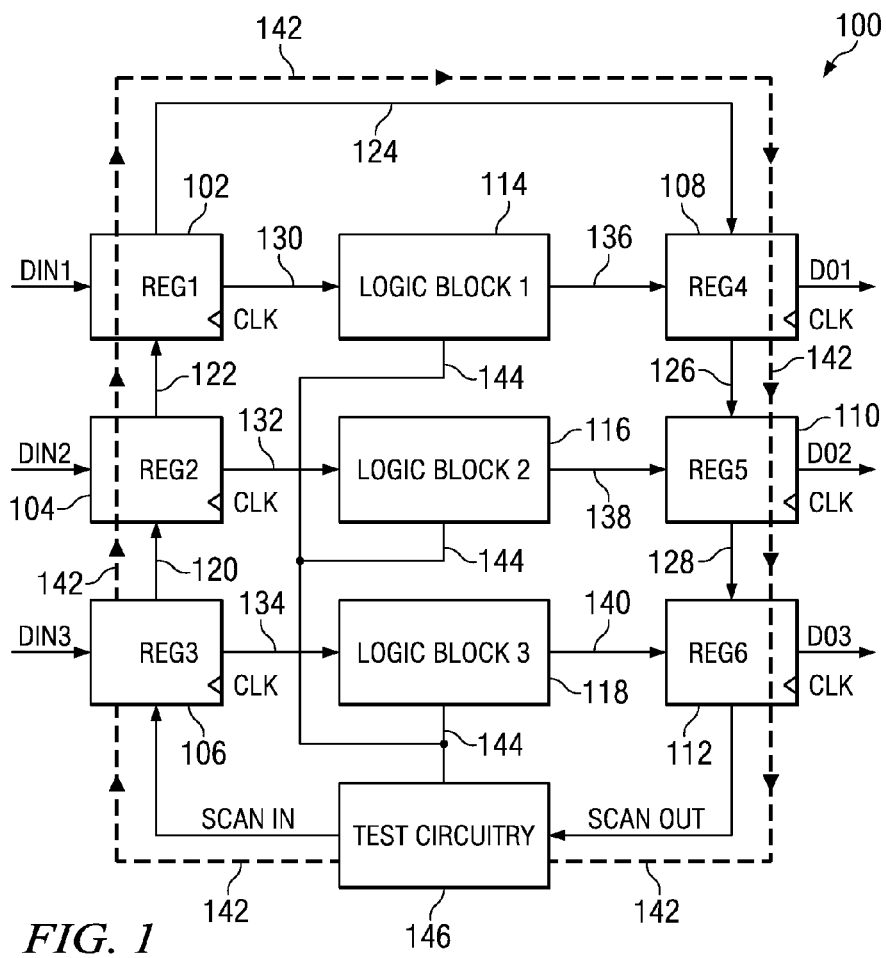
FIG. 1 is a schematic drawing of an embodiment of a system for testing logical blocks for faults using a scan chain.

FIG. 1 is a schematic drawing of an embodiment of a system 100 for testing logical blocks 114, 116 and 118 for faults using a scan chain. During normal operation, the registers 102, 104 and 106 receive data from inputs DIN1, DIN2 and DIN3 respectively. After receiving the data, the registers 102, 104 and 106, during a phase of the clock CLK, apply the data to the logic blocks 114, 116, and 118 respectively. The output, 136, 138 and 140, from the logic blocks 114, 116 and 118 respectively is stored in registers 108, 110 and 112 respectively. On a later phase of clock CLK, the outputs DO1, DO2 and DO3 are output to other circuits (not shown). In this example, a test signal 144 is also provided to be used during the testing of logic blocks 114, 116 and 118.

In test mode, test data is scanned into registers 102, 104 and 106 via the scan chain 142 from test circuitry 146. In this example, in order to scan a test value into registers 102, 104 and 106, the scan chain is clocked three times. After the test values have been received by registers 102, 104 and 106, the test values are applied to logic blocks 114, 116 and 118. The test output values are driven into registers 108, 110 and 112 respectively. After receiving the test output values, the scan chain 142 is clocked three times in order to drive the test output values into the test circuitry 146. After the test circuitry 145 receives the test output values, the test output values are observed to determine whether a fault has occurred in any of the logic blocks 114, 116 and 118.

Figure 2:
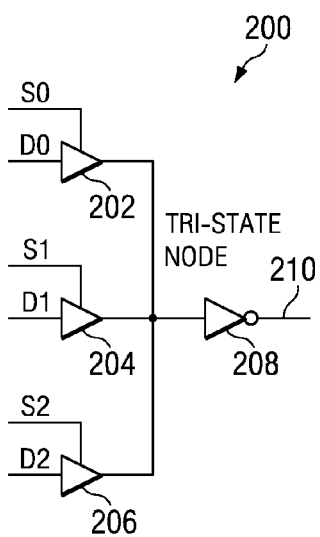
FIG. 2 is a schematic drawing of an embodiment of a one-hot transmission-gate multiplexer.

FIG. 2 is a schematic drawing of an embodiment of a one-hot transmission-gate multiplexer 200. The one-hot transmission-gate multiplexer 200 is an example of a logic block that may be tested as shown in FIG. 1. In this example of a one-hot transmission-gate multiplexer, one and only one bit of data, D0, D1 or D2, may be selected at one time. The bit of data that is selected is determined when one and only one select signal, S0, S1 or S2, is activated. When a particular bit of data is selected, the data selected drives the tri-state node to a voltage that represents a logical one or a logical zero. The voltage on the tri-state node then drives the output 210 of the inverter 208 to a logical value.

In addition to being able to selected one and only one bit of data, a one-hot transmission-gate multiplexer 200 may select none of the bits of data D0, D1 or D2. When none of the bits of data D0, D1 or D2 are selected, the tri-state node remains in a high impedance state (often called a "high z" state). The high-z state may be tested by adding a pull-up device (e.g. a PMOS (p-type metal-oxide semiconductor)) transistor.

Figure 3:
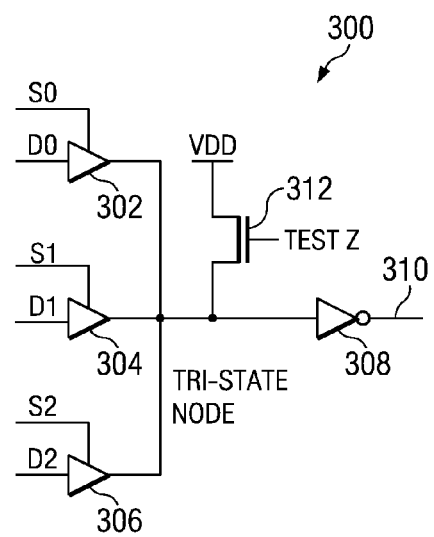
FIG. 3 is a schematic drawing of an embodiment of a one-hot transmission-gate multiplexer with a pull-up PFET connected to the tri-state node.

FIG. 3 is a schematic drawing of an embodiment of a one-hot transmission-gate multiplexer 300 with a pull-up PFET 312 connected to the tri-state node. During normal operation (i.e. not during testing) of the one-hot transmission-gate multiplexer the added pull-up PFET 312 is inactivated. The pull-up PFET 312 is inactivated by applying a logical high voltage on the gate testz of the pull-PFET 312. When a logical high voltage is applied on the gate textz, the pull-PFET 312 does not conduct current.

However, when testing a tri-state node in the one-hot transmission-gate multiplexer 300, the pull-up FET 312 may be activated to try to pull the tri-state node to a high logical value. The pull-up FET 312, in this example, may be activated by asserting a low logical value to the gate testz of the pull-up FET. When the tri-state node is driven by data on a selected transmission-gate, 302-306, the pull-up PFET is not strong enough to change the logical value asserted by the selected transmission gate 302-306.

In this example, when a tri-state node in a one-hot transmission-gate multiplexer 300 is tested, faults may be indicated. The faults may be caused by stuck-at faults or opens located in the one-hot transmission-gate multiplexer or they may be used by a struck-at fault or open in the test chain.

The transmission gates 302, 304 and 306 in is this embodiment may be formed using NFETs (n-type field-effect transistor) where the select signal is connected to the gate of the NFET, the data in of the transmission gate is connected of the drain of the NFET and the output of the transmission gate is connected to the source of the NFET. The transmission gates 302, 304 and 306 in is this embodiment may also be formed using NFETs (n-type field-effect transistor) and PFETs in parallel where the gate of the NFET is connected to the control signal, the drains of the FETs are connected to the input of the transmission gate, and the sources of the FETs are connected to the output of the transmission gate. The gate of the PFET is connected to an inverter that applies the opposite logical state of the state on the gate of the NFET.

Figure 4:
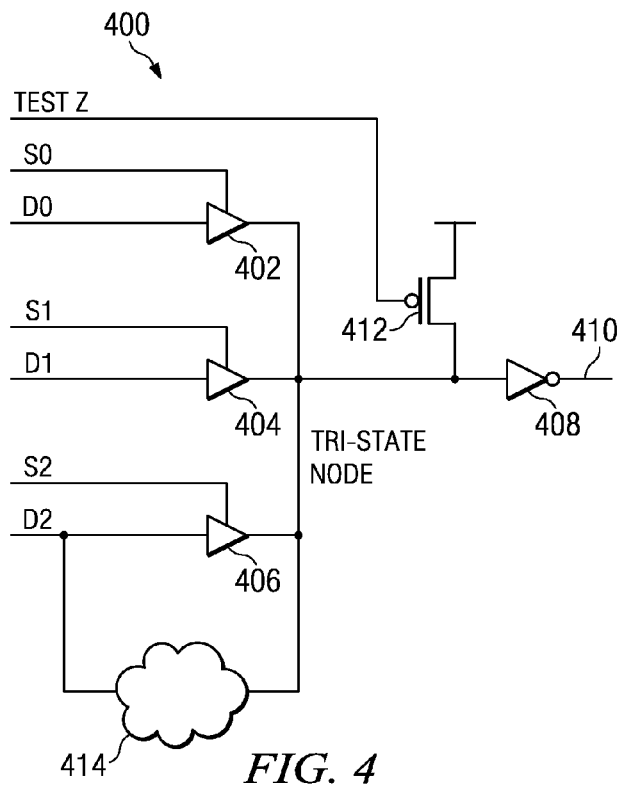
FIG. 4 is a schematic drawing of an embodiment of a one-hot transmission-gate multiplexer with a pull-up PFET connected to the tri-state node where a stuck-at one fault is tested.

FIG. 4 is a schematic drawing of an embodiment of a one-hot transmission-gate multiplexer with a pull-up PFET 412 connected to the tri-state node where a stuck-at one fault is tested. In this example, because of a manufacturing defect 414, data D2 is shorted to the tri-state node. In this example, none of the data selects are activated (e.g. they are driven to a logical low level) and all the data inputs, d0-d2, are driven to logical low level as well. Because none of the transmission gates, 402-406, are activated, the tri-state node would be expected to be logical high value because the testz node is low on the pull-up PFET 312. However, because a manufacturing defect 414 shorted data d2 to the tri-state node, the logical value on the tri-state is a logical zero and the output 412 of the one-hot transmission-gate multiplexer 400 is a logical one. Because of the manufacturing defect 414, the output 412 of the one-hot transmission-gate multiplexer is stuck at a logical one.

Figure 5:
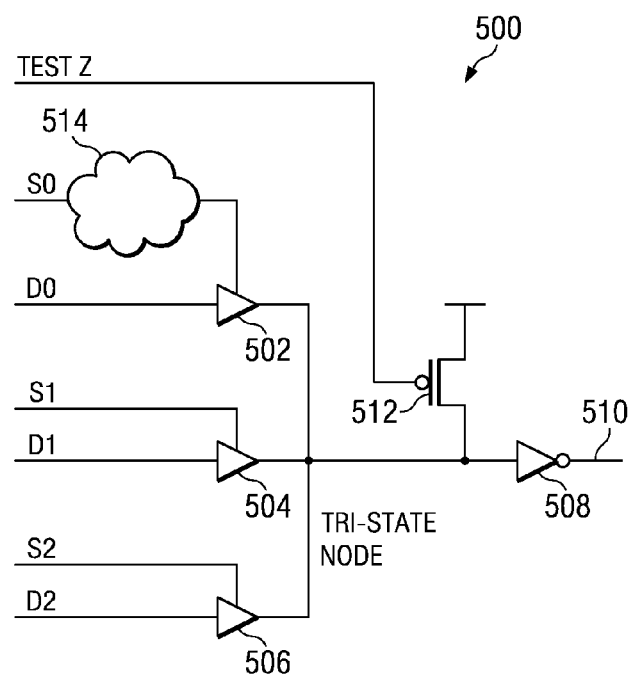
FIG. 5 is a schematic drawing of an embodiment of a one-hot transmission-gate multiplexer with a pull-up PFET connected to the Tri-state node where a stuck-at zero fault is tested.

FIG. 5 is a schematic drawing of an embodiment of a one-hot transmission-gate multiplexer with a pull-up PFET 512 connected to the tri-state node where a stuck-at zero fault is tested. In this example, because of a manufacturing defect 514, data select S0 is shorted to ground instead of being a logical high as programmed for testing. In this test example, S1-S2 and all the data inputs, d0-d2, are driven to logical low levels for testing. The expected output in this test case is a one but because S0 is shorted, a logical zero is not transferred from the input D0 of transmission gate 502 to the tri-state node as desired. Instead, because the manufacturing defect 514 shorted S0 to ground, the pull-up FET 512 pulls the tri-state node to a high logical value. Because of the manufacturing defect 514, the output 510 of the one-hot transmission-gate multiplexer 500 is stuck at a logical zero.

In another example, because of manufacturing defect 514, data select S0 is shorted to a logical high value instead of being a logical low as programmed for testing. In this test example, S1-S2 and all the data inputs, D0-D2, are driven to logical low levels for testing. The expected output in this test case is a zero but because S0 is shorted to high logical value, a logical zero is transferred from the input D0 of transmission gate 502 to the tri-state node. The logical low value on D0 overrides the weak pull-up of PFET 512 and as result, the output 510 of the one-hot transmission-gate multiplexer 500 is stuck at a logical one.

In the previous two examples of stuck-at faults, it was determined that the one-hot transmission gates were stuck at a certain logical value. It was not determined what caused the stuck-at fault, only that there was a fault.

The signal testz used in determining these stuck-at faults could also have manufacturing defects. However, the system shown in FIG. 1 would not be able to determine whether the signal testz has a fault. In addition, if the signal testz did have a fault, the examples of testing for stuck-at faults in one-hot transmission gates may be inaccurate.

Figure 6:
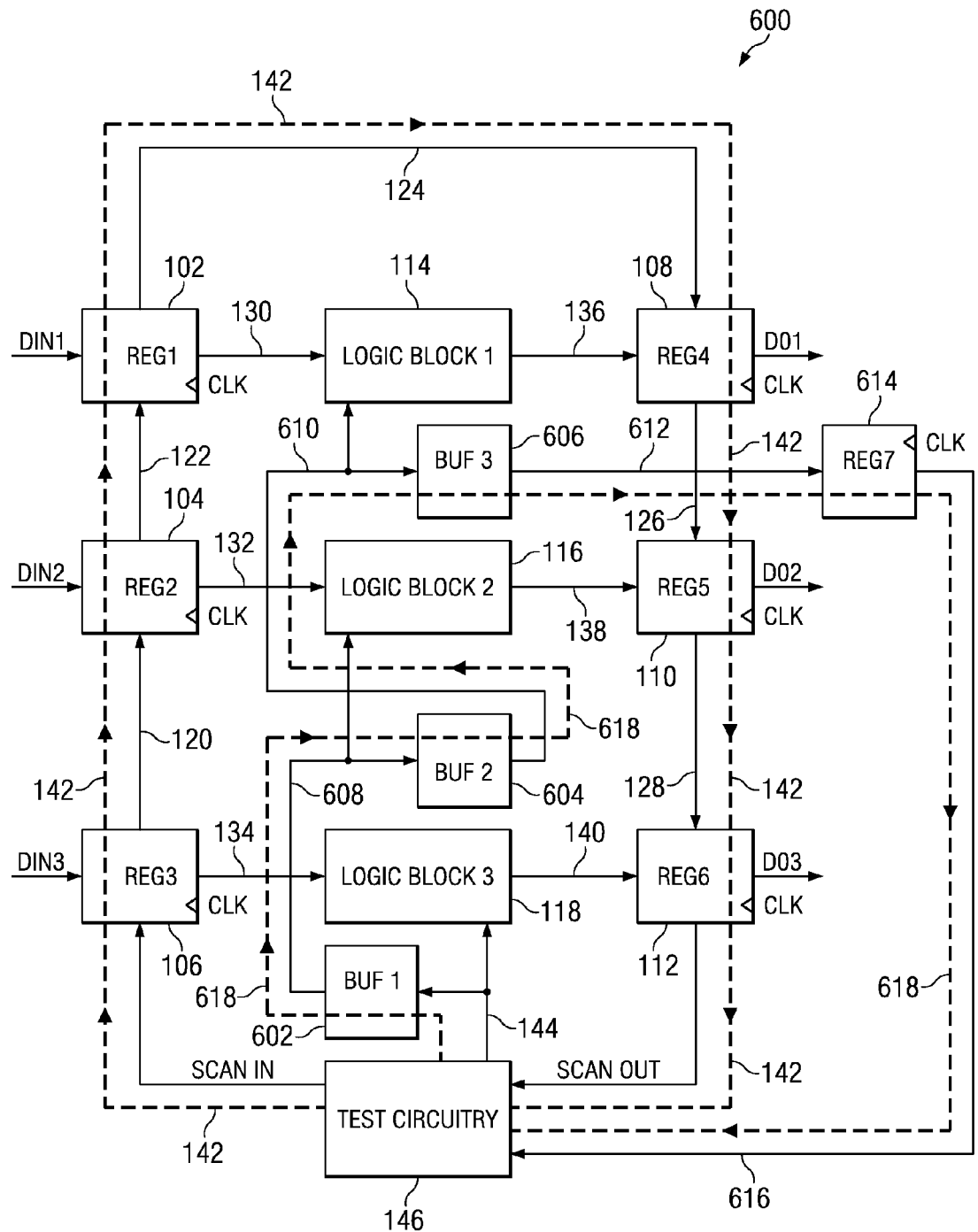
FIG. 6 is a schematic drawing of an embodiment of a system for testing logical blocks and a test chain for faults.

FIG. 6 is a schematic drawing of an embodiment of a system 600 for testing logical blocks 114, 116 and 118 for faults and testing test chain 618 for faults. During normal operation, the registers 102, 104 and 106 receive data from inputs DIN1, DIN2 and DIN3 respectively. After receiving the data, the registers 102, 104 and 106, during a phase of the clock CLK, apply the data to the logic blocks 114, 116, and 118 respectively. The output, 136, 138 and 140, from the logic blocks 114, 116 and 118 respectively is stored in registers 108, 110 and 112 respectively. On a later cycle of clock CLK, the outputs DO1, DO2 and DO3 are output to other circuits (not shown). In this example, a test chain 618 is also used during the testing of logic blocks 114, 116 and 118.

In test mode, test data is scanned into registers 102, 104 and 106 via the scan chain 142 from test circuitry 146. In this example, in order to scan a test value into registers 102, 104 and 106, the scan chain is clocked three times. After the test values have been received by registers 102, 104 and 106, the test values are applied to logic blocks 114, 116 and 118. The test output values are driven into registers 108, 110 and 112 respectively. After receiving the test output values, the scan chain 142 is clocked three times in order to drive the test output values into the test circuitry 146. After the test circuitry 146 receives the test output values, the test output values are evaluated to determine whether a fault has occurred in any of the logic blocks 114, 116 and 118. The test circuitry 146 may be located on an IC with the test system 600 or the test circuitry 146 may be located off the IC.

Also in test mode, the test chain 618 may be tested for faults. Because buffers 602-606 and a register 614 have been added to the test signal 144, the test chain 618 may be tested.

For example, if a fault occurs in the test chain 618, the state of the fault may be captured by register 614. After capturing the state of the fault in the test chain, the register scans this state to the test circuitry 146. Including buffers 602-606 allows the test chain 618 to be observed and tested.

Figure 7:
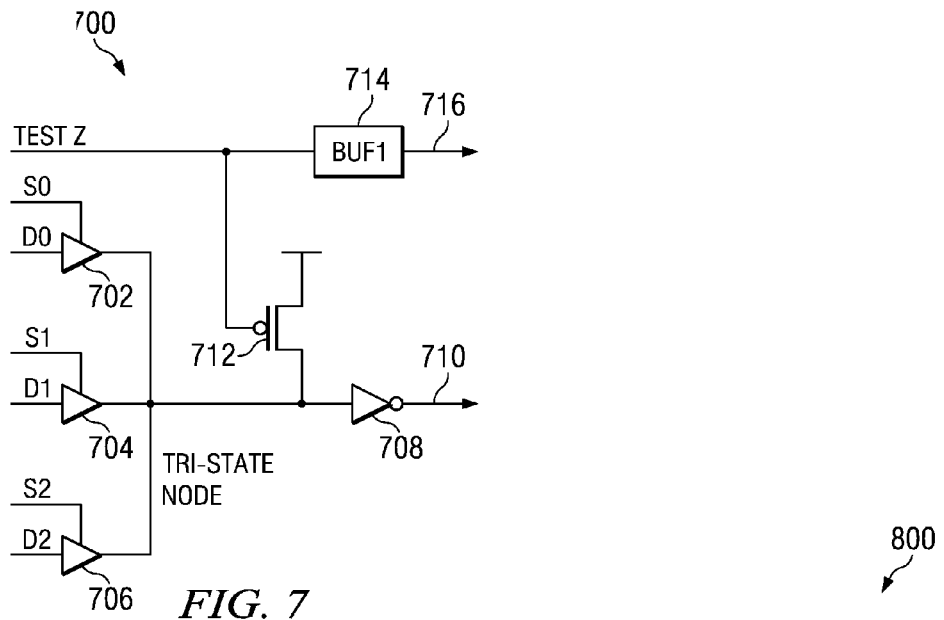
FIG. 7 is a schematic drawing of an embodiment of a one-hot transmission-gate multiplexer with a pull-up PFET connected to the tri-state node and a buffer.

FIG. 7 is a schematic drawing of an embodiment of a one-hot transmission-gate multiplexer 700 with a pull-up PFET 712 connected to the tri-state node and a buffer 714. During normal operation (i.e. not during testing) of the one-hot transmission-gate multiplexer the pull-up PFET 712 is inactivated. The pull-up PFET 712 is inactivated by applying a logical high voltage on the gate testz of the pull-PFET 712. When a logical high voltage is applied on the gate textz, the pull-PFET 312 does not conduct current. In addition, the signal testz is connected to the input of the buffer 714.

However, when testing a tri-state node in the one-hot transmission-gate multiplexer 700, the pull-up FET 712 may be activated to try to pull the tri-state node to a high logical value. The pull-up FET 712, in this example, may be activated by asserting a low logical value to the gate testz of the pull-up FET. When the tri-state node is driven by data on a selected transmission-gate, 702-706, the pull-up PFET is not strong enough to change the logical value asserted by the selected transmission gate 702-706.

In this example, when a tri-state node in a one-hot transmission-gate multiplexer 700 is tested, faults may be indicated. The faults may be caused by stuck-at faults or opens located in the one-hot transmission-gate multiplexer 700 or they may be used by a struck-at fault or open in the test chain. Because a buffer 714 has been added to the one-hot transmission gate multiplexer 700, a test chain may be observed and tested.

The transmission gates 702, 704 and 706 in is this embodiment may be formed using NFETs (n-type field-effect transistor) where the select signal is connected to the gate of the NFET, the data in of the transmission gate is connected of the drain of the NFET and the output of the transmission gate is connected to the source of the NFET. The transmission gates 702, 704 and 706 in is this embodiment may also be formed using NFETs (n-type field-effect transistor) and PFETs in parallel where the gate of the NFET is connected to the control signal, the drains of the FETs are connected to the input of the transmission gate, and the sources of the FETs are connected to the output of the transmission gate. The gate of the PFET is connected to an inverter that applies the opposite logical state of the state on the gate of the NFET.

Figure 8:
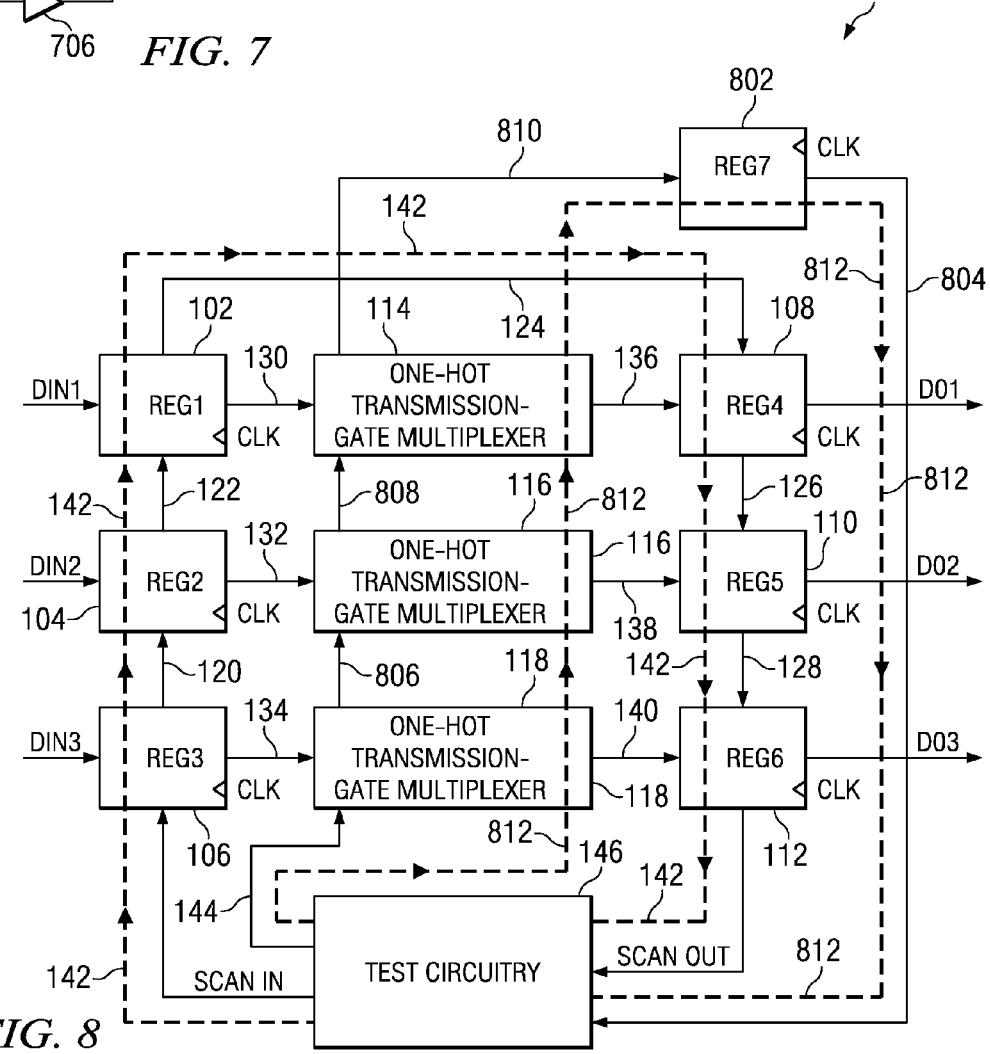
FIG. 8 is a schematic drawing of an embodiment of a system for testing one-hot transmission gate multiplexers 114, 116 and 118 for faults using a scan chain and a test chain.

FIG. 8 is a schematic drawing of an embodiment of a system 800 for testing one-hot transmission-gate multiplexers 114, 116 and 118 for faults using a scan chain and a test chain. During normal operation, the registers 102, 104 and 106 receive data from inputs DIN1, DIN2 and DIN3 respectively. After receiving the data, the registers 102, 104 and 106, during a phase of the clock CLK, apply the data to the logic blocks 114, 116, and 118 respectively. The output, 136, 138 and 140, from the logic blocks 114, 116 and 118 respectively is stored in registers 108, 110 and 112 respectively. On a later phase of clock CLK, the outputs DO1, DO2 and DO3 are output to other circuits (not shown). In this example, a test signal 144 is also provided to be used during the testing of logic blocks 114, 116 and 118.

In test mode, test data is scanned into registers 102, 104 and 106 via the scan chain 142 from test circuitry 146. In this example, in order to scan a test value into registers 102, 104 and 106, the scan chain is clocked three times. After the test values have been received by registers 102, 104 and 106, the test values are applied to logic blocks 114, 116 and 118. The test output values are driven into registers 108, 110 and 112 respectively. After receiving the test output values, the scan chain 142 is clocked three times in order to drive the test output values into the test circuitry 146. After the test circuitry 146 receives the test output values, the test output values are evaluated to determine whether a fault has occurred in any of the one-hot transmission-gate multiplexers 114, 116 and 118. The test circuitry 146 may be located on an IC with the test system 800 or the test circuitry 146 may be located off the IC.

Also in test mode, the test chain 812 may be tested for faults. Because buffers (as shown in FIG. 7) have added to the one-hot transmission-gate multiplexers 114-118 and a register 802 has been added, the test chain 812 may be tested. For example, if a fault occurs in the test chain 812, the state of the fault may be captured by register 802. After capturing the state of the fault in the test chain 812, the register 802 scans this state to the test circuitry 145. Including buffers in the one-hot transmission-gate multiplexers 114-118 allows the test chain 812 to be observed and tested.

The previous embodiments of the invention were discussed with respect to internal scan (internal testing of an integrated circuit). Boundary scan, however, is typically used for board level testing, and not for internal testing of an IC. Other embodiments of this invention may be used in boundary scan applications. For example, testing the functionality of a test chain used to test tri-state nodes on a board may done with this invention as well.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A system for detecting faults on a test chain, the system comprising:

a circuit having at least an output wherein the output of the circuit provides a test signal;

the test chain having an input, a plurality of buffers connected in series and an output; wherein the input of the test chain is directly connected to the output of the circuit and an input of a first buffer in the plurality of buffers; wherein an output of a last buffer in the plurality of buffers is directly connected to the output of the test chain;

a register having at least an input and an output; wherein the input of the register receives a logical value representing the output of the test chain; wherein the logical value may be observed by test circuitry;

a plurality of pull-up devices wherein each pull-up device in the plurality of pull-up devices has a control input, an input and an output; wherein the control input of first pull-up device is connected to the input of the test chain; wherein each of the remaining control inputs is connected to an output of a buffer respectively; wherein each output of the plurality of pull-up devices is directly connected to an individual tri-state node respectively; wherein each input of the plurality of pull-up devices is directly connected to a DC voltage;

wherein the plurality of pull-up devices are activated only when the tri-state nodes are tested.

2. The system of claim 1 wherein the outputs of the plurality of pull-up devices are directly connected respectively to tri-state nodes in a plurality of one-hot transmission gate multiplexers.

3. The system of claim 2 wherein each one-hot transmission gate multiplexer in the plurality of one-hot transmission gate multiplexers comprises:
a plurality of transmission gates wherein each transmission gate of the plurality of transmission gates comprises a data input, a select input and an output;
an inverter having an input and an output wherein the input of the inverter is directly connected to a tri-state node;
wherein the outputs of the transmissions gates are directly tied to the tri-state node;
wherein the tri-state node is in tri-state mode when none of the select inputs are selected.

4. The system of claim 3 wherein each transmission gate of the plurality of transmission gates further comprises a NFET (n-type field-effect transistor) wherein the select input is directly connected to a gate of the NFET, the data input is directly connected to a drain of the NFET and the output of is directly connected to a source of the NFET.

5. The system of claim 3 wherein each transmission gate of the plurality of transmission gates further comprises a NFET (n-type field-effect transistor) and a PFET (p-type field-effect transistor);
wherein the select input is directly connected to a gate of the NFET;
wherein an inverted logical value of the select input is directly connected to a gate of the PFET;
the data input is directly connected to a drain of the NFET and a source of the PFET; and
wherein the output of is directly connected to a source of the NFET and a drain of the PFET.

6. The system of claim 1 wherein each pull-up device in the plurality of pull-up devices further comprises PFET (p-type field-effect transistor);
wherein the control input of the pull-up device is directly connected to a gate of the PFET;
wherein the input of the pull-up device is directly connected to a source of the PFET; and
wherein the output of the pull-up device is directly connected to a drain of the PFET.

7. The system of claim 1 wherein a fault detected on the test chain is a stuck-at one fault.

8. The system of claim 1 wherein a fault detected on the test chain is a stuck-at zero fault.

9. The system of claim 1 wherein a fault detected on the test chain is an open fault.

10. The system of claim 1 wherein the test circuitry is physically located on the same IC as the system.

11. The system of claim 1 wherein the test circuitry is not physically located on the same IC as the system.

12. A system for detecting faults on a test chain, the system comprising:
a circuit having at least an output wherein the output of the circuit provides a test signal;
a plurality of one-hot transmission gate multiplexers wherein each one-hot transmission gate multiplexer comprises:
a plurality of transmission gates wherein each transmission gate of the plurality of transmission gates comprises a data input, a select input and an output; the output connected to a tri-state node;
a pull-up device having a control input, an input and an output; wherein the input is directly connected to a DC voltage and the output is directly connected to the tri-state node,
an inverter having an input and an output wherein the input of the inverter is directly connected to the tri-state node;
a buffer having an input and an output; wherein the input of the buffer is directly connected to the control input of the pull-up device
a register having at least an input and an output; wherein the input of the register receives a logical value representing the output of a last buffer in the plurality of one-hot transmission gate multiplexers; wherein the logical value may be observed by test circuitry;
wherein the control input of the first pull-up device in the plurality of one-hot transmission gate multiplexers receives the test signal;
wherein the control inputs of all pull-up devices expect the first pull-device are directly connected to the output of the previous buffer;
wherein the pull-up devices are activated only when the tri-state nodes are tested.

13. The system of claim 12 wherein each transmission gate of the plurality of transmission gates further comprises a NFET (n-type field-effect transistor) and a PFET (p-type field-effect transistor);
wherein the select input is directly connected to a gate of the NFET;
wherein an inverted logical value of the select input is directly connected to a gate of the PFET;
the data input is directly connected to a drain of the NFET and a source of the PFET; and
wherein the output of is directly connected to a source of the NFET and a drain of the PFET.

14. The system of claim 12 wherein each pull-up device in the plurality of one-hot transmission gate multiplexers further comprises PFET (p-type field-effect transistor);
wherein the control input of the pull-up device is directly connected to a gate of the PFET;
wherein the input of the pull-up device is directly connected to a source of the PFET; and
wherein the output of the pull-up device is directly connected to a drain of the PFET.

* * * * *